United States Patent
Her et al.

(10) Patent No.: US 8,541,066 B2
(45) Date of Patent: Sep. 24, 2013

(54) LIGHT-INDUCED DIRECTED SELF-ASSEMBLY OF PERIODIC SUB-WAVELENGTH NANOSTRUCTURES

(75) Inventors: Tsing-Hua Her, Charlotte, NC (US); Haitao Zhang, Charlotte, NC (US); Mingzhen Tang, Charlotte, NC (US)

(73) Assignee: University of North Carolina at Charlotte, Charlotte, NC (US)

( * ) Notice: Subject to any disclaimer, the term of this patent is extended or adjusted under 35 U.S.C. 154(b) by 1017 days.

(21) Appl. No.: 12/323,729

(22) Filed: Nov. 26, 2008

(65) Prior Publication Data

US 2009/0214885 A1  Aug. 27, 2009

Related U.S. Application Data

(60) Provisional application No. 60/990,131, filed on Nov. 26, 2007.

(51) Int. Cl.
*C08J 7/18* (2006.01)

(52) U.S. Cl.
USPC ........... 427/553; 427/554; 427/582; 427/584; 216/13

(58) Field of Classification Search
USPC ............... 427/553, 554, 582, 584; 216/13
See application file for complete search history.

(56) References Cited

U.S. PATENT DOCUMENTS

| | | | |
|---|---|---|---|
| 5,635,089 A | 6/1997 | Singh et al. | |
| 6,333,485 B1 | 12/2001 | Haight et al. | |
| 6,591,154 B2 | 7/2003 | Haight et al. | |
| 6,656,539 B1 | 12/2003 | Haight et al. | |
| 7,170,030 B2 | 1/2007 | Haight et al. | |
| 7,211,300 B2 | 5/2007 | Haight et al. | |
| 7,238,294 B2 | 7/2007 | Koops et al. | |
| 2001/0028925 A1* | 10/2001 | Moshrefzadeh et al. | 427/552 |
| 2002/0125230 A1 | 9/2002 | Haight et al. | |
| 2003/0127441 A1 | 7/2003 | Haight et al. | |
| 2004/0091638 A1* | 5/2004 | Haight et al. | 427/582 |
| 2005/0072753 A1 | 4/2005 | Koops et al. | |
| 2006/0243712 A1 | 11/2006 | Haight et al. | |
| 2008/0011718 A1 | 1/2008 | Koops et al. | |
| 2008/0216926 A1 | 9/2008 | Guo et al. | |
| 2009/0258166 A1* | 10/2009 | Karg et al. | 427/595 |

OTHER PUBLICATIONS

S. R. J. Brueck and D. J. Ehrlich; "Stimulated Surface-Plasma-Wave Scattering and Growth of a Periodic Structure in Laser-Photodeposited Metal Films"; Physical Review Letters, vol. 48, No. 24; Lexington, Massachusetts, 1982.

(Continued)

*Primary Examiner* — Binh X Tran
(74) *Attorney, Agent, or Firm* — Clements Bernard PLLC; Christopher L. Bernard; Lawrence A. Baratta, Jr.

(57) ABSTRACT

In various exemplary embodiments, the present invention provides a system for the light-induced directed self-assembly (LIDSA) of periodic sub-wavelength nanostructures, including: a light source for delivering a beam of photons; a reaction chamber disposed adjacent to the light source; a gas including one or more precursor materials disposed within the reaction chamber; and a substrate disposed within the reaction chamber, wherein the substrate is positioned and configured to receive the beam of photons; wherein the beam of photons causes a periodic sub-wavelength nanostructure of one or more constituents of the one or more precursor materials to form on a surface of the substrate. In various exemplary embodiments, the present invention also provides an associated method.

11 Claims, 15 Drawing Sheets

(56) References Cited

OTHER PUBLICATIONS

S. Basu, Y.-B. Chen and Z. M. Zhang; "Microscale radiation in thermophotovoltaic devices—A review"; International Journal of Energy Research, Published online Dec. 6, 2006 in Wiley InterScience; Copyright 2006 John Wiley & Sons, Ltd., Atlanta, GA.
Rod Taylor, Cyril Hnatovsky, and Eli Simova; Applications of femtosecond laser induced self-organized planar nanocracks inside fused silica glass; Laser & Photonics Review, Rev. 2, No. 1-2, 26-47, (C)2008 by Wiley-vch Verig GmbH & Co. KGaA, Weinheim; Canada.
R. Haight, P. Longo, and A. Wagner; "Metal deposition with femtosecond light pulses at atmospheric pressure", J. Vac. Sci. Technol. A21(3), May/Jun. 2003, C2003 American Vacuum Society; Yorktown Heights, NY.
Tsing-Hua Her, Richard J. Finlay, Claudia Wu, Shrenik Deliwala and Eric Mazur; "Microstructuring of silicon with femtosecond laser pulses"; Applied Physics Letters, vol. 73, No. 12, Sep. 21, 1998; Cambridge, Massachusetts.
Henry H. Hwu and Jingguang G. Chen; "Potential Application of Tungsten Carbides as Electrocatalysts. 1. Decomposition of Methanol over Carbide-Modified W(111)"; J. Phys. Chem. B 2003, 107, 2029-2039; (C)2001 American Chemical Society, Published on Web Sep. 13, 2001.
Henry H. Hwu and Jingguang G. Chen; Potential Application of Tungsten Carbides as Electrocatalysts: 4. Reactions of Methanol, Water, and Carbon Monoxide over Carbide-Modified W(110); J. Phys. Chem. B 2003, 107, 2029-2039; C2003 American Chemical Society, published on Web Feb. 11, 2003.
Zengtao Liu, Chungho Lee, Venkat Narayanan, Gen Pei, and Edwin Chihchuan Kan; Metal Nanocrystal Memories—Part I: Device Design and Fabrication; IEEE Transactions on Electron Devices, vol. 49, No. 9, Sep. 2002.
Nancy Stauffer; "Efficient photovoltaic power—without the sun"; MITEI MIT Energy Initiative; Research Paper.
John Markoff; SLIPSTREAM—Intuition + Money: An Aha Moment; NY Times, Oct. 12, 2008.
M Ranjbar, A Iraji Zad, and S M Mahdavi; Gasochromic tungsten oxide thin films for optical hydrogen sensors; Journal of Physics D: Applied Phys. 41 (2008) 055405 (5pp); 2008 IOP Publishing Ltd., Printed in the UK; Published Feb. 13, 2008, Tehran, Islamic Republic of Iran.
Anthony E. Siegman, and Philippe M. Fauchet; Stimulated Wood's Anomalies on Laser-Illuminated Surfaces; IEEE Journal of Quantum Electronics, vol. QE-22, No. 8, Aug. 1986, Princeton, NJ.
A.A. Tomchenko, I.L. Emelianov, V.V. Khatko; Tungsten trioxide-based thick-film NO sensor: design and investigation; (C)1999 Elsevier Science S.A. All rights reserved; Sensors and Actuators B 57 (1999) 166-170, Accepted Jan. 19, 1999.
X. G. Yang and C. Y. Wang; "Nanostructured tungsten carbide catalysts for polymer electrolyte fuel cells"; Applied Physics Letters 86, 224104; American Institute of Physics (2005).
Quan-Zhong Zhao, Stefan Malzer, and Li-Jun Wang; Self-organized tungsten nanospikes grown on subwavelength ripplesinduced by femtosecond laser pulses; Nov. 26, 2007, vol. 15, No. 24, Optics Express 15742, (C) 2007 OSA.
Michael E. Walsh, Yaowu Hao, C. A. Ross, and Henry I. Smith; "Optimization of a lithographic and ion beam etching process for nanostructuring magnetoresistive thin film stacks"; J. Vac. Sci. Technol. B 18(6), Nov./Dec. 2000; (C)2000 American Vacuum Society, Cambridge, Massachusetts.
A. Y. Vorobyev and Chunlei Guo; "Colorizing metals with femtosecond laser pulses"; Applied Physics Letters 92, 041914 (2008); (C) 2008 American Institute of Physics, New York.

* cited by examiner

LIGHT-INDUCED DIRECTED SELF-ASSEMBLY OF PERIODIC SUB-WAVELENGTH NANOSTRUCTURES

CROSS-REFERENCE TO RELATED APPLICATION(S)

The present non-provisional patent claims the benefit of priority of U.S. Provisional Patent Application No. 60/990,131, filed on Nov. 26, 2007, and entitled "TUNGSTEN NANOSTRUCTURES," the contents of which are incorporated in full by reference herein.

STATEMENT REGARDING FEDERALLY-SPONSORED RESEARCH OR DEVELOPMENT

The U.S. Government has a paid-up license in the present invention and the right, in limited circumstances, to require the patent owner to license to others on reasonable terms as provided for by the terms of Contract No. W911NF-05-2-0053 awarded by the Defense Advanced Research Projects Agency (DARPA).

FIELD OF THE INVENTION

The present invention relates generally to the light-induced directed self-assembly (LIDSA) of periodic sub-wavelength nanostructures. More specifically, the present invention relates to systems and methods for fabricating periodic sub-wavelength nanostructures using laser chemical vapor deposition (LCVD) at or near room temperature. These systems and methods incorporate a single ultraviolet femtosecond pulsed laser or the like without beam shaping, such as the use of masks or holography, to form periodic sub-wavelength nanostructures of tungsten or the like, when using tungsten hexacarbonyl or the like as a precursor, on a variety of substrates.

BACKGROUND OF THE INVENTION

Holographic interference lithography (HIL) involves the intersection of two or more laser beams to form periodic sub-wavelength nanostructures of photosensitive materials, such as photopolymers and glasses. In some configurations, a single laser beam may be used in conjunction with a diffracting photomask grating, wherein diffracted laser beams interfere to generate periodic patterns in the near field. The minimum periodicity that may be achieved using this method is about half of the laser wavelength. Periodic sub-wavelength nanostructures of materials other than photopolymers may be formed by incorporating chemical etching and/or material deposition techniques.

It is known that when a material is exposed to an intense laser beam close to its melting threshold, the surface of the material may spontaneously develop light-induced periodic surface structures (LIPSSs). The most accepted theories interpret LIPSSs as being the result of inhomogeneous energy distribution caused by the interference between the incident laser beam and a scattered surface wave and/or reflected/refracted light. The spacing of LIPSSs is determined by the laser wavelength, incident angle, polarization, and, if the surface wave is inside of the material, the refractive indices of the substrates. Recently, using intense femtosecond pulsed lasers, periodic sub-wavelength nanostructures, such as cracks and/or refractive index modifications, have been obtained inside or on the surface of transparent bulk materials. These features have been shown to scale with laser wavelength. However, due to their disruptive nature, these features may only be produced using amplified femtosecond pulses with a pulse energy that is at least a few hundred nanojoules or an intensity that is at least a few hundred terawatts per square centimeter.

LCVD involves the dissociation of precursors and the subsequent deposition of desired materials on a substrate induced by a laser beam, either pyrolytically or photolytically, as opposed to by direct substrate heating. Using LCVD, a variety of materials may be deposited via the selection of the appropriate precursors. LCVD provides advantages over conventional thermal chemical vapor deposition (CVD) in terms of reduced processing temperature and improved feature size spatial resolution.

Direct-writing (DW-LCVD) involves the initiation of the localized decomposition of precursor molecules either photo-thermally, photo-chemically, or by a combination of both using a laser beam. Advantageously, it may be used to pattern materials that are incompatible with conventional photolithography, thereby reducing processing steps to minimize cross-contamination and/or cost, reduce processing temperature on heat-sensitive substrates, and fabricate functional structures three-dimensionally. A variety of precursors have been developed for DW-LCVD, to deposit materials ranging from metals, to semiconductors, to dielectrics, rendering DW-LCVD a versatile tool for rapid prototyping. The feature size obtained by DW-LCVD is limited by diffraction to about half of the laser wavelength. Higher spatial resolution may be achieved by exciting precursor molecules either at near field or using a shorter wavelength. However, the former suffers from low throughput of light, while the latter requires a short-wavelength light source and associated optics, which are not readily available. Another method of achieving higher spatial resolution is by utilizing a nonlinear process during deposition, such as the diffusion and nucleation of radicals on the surface, exploiting the temperature dependence of the thermal reaction rate, and the multi-photon absorption-induced decomposition of precursors. For example, the DW-LCVD of chromium nanowires using chromium hexacarbonyls on a variety of substrates has been demonstrated by employing a 100-femtosecond 400-nm pulsed laser. Line widths as small as 100 nm (corresponding to $\lambda/4$, where $\lambda$ is the vacuum wavelength of the laser beam) have been achieved as a result of the combination of the multi-photon absorption-induced decomposition of precursors and the tight focusing of incident light (NA=0.9), which makes the further reduction of feature size very difficult.

DW-LCVD is, by its nature, a serial process that is slow as compared to the parallel process of conventional photolithography. In order to form a two-dimensional feature, such as a plurality of lines or a patch, multiple scans with appropriate offsets between the scans are required. In addition, the morphology of the deposition in conventional DW-LCVD follows, either linearly or nonlinearly, the energy distribution at the laser focus, which is a Gaussian function or the like. This results in depositions with smooth profiles and limited morphological variations, such as lines, dots, or a combination of both.

Thus, what is still needed in the art is a DW-LCVD technique that is capable of generating a feature size of $\lambda/5$ or smaller, for example, processing multiple features simultaneously, and controlling the morphology of the deposited features, among other advantages.

BRIEF SUMMARY OF THE INVENTION

In various exemplary embodiments, the present invention provides a DW-LCVD technique that is capable of generating a feature size of λ/5 or smaller, for example, processing multiple features simultaneously, and controlling the morphology of the deposited features, among other advantages. By gently focusing a single 400-nm 150-femtosecond laser beam or the like onto the surface of a substrate disposed in a vacuum chamber at or near room temperature with tungsten hexacarbonyl ($W(CO)_6$) or the like as a precursor, the spontaneous formation of one-dimensional periodic or quasi-periodic nanostructures of tungsten or the like are grown heterogeneously on top of the underlying substrate without requiring any beam shaping, such masks or holography. The nanograting is formed simultaneously, and has a very small feature size. Metallic nanogratings with excellent long-range order are achieved simply by translating the substrate with respect to the laser focus. These metallic nanogratings may be formed on top of a variety of metals, semiconductors, and dielectrics, suggesting that the phenomenon of the present invention is a universal one. Considering the range of materials that may be deposited using DW-LCVD, the systems and methods of the present invention provide a simple, cost-effective, and flexible means to pattern periodic structures. Advantageously, micro and nanostructures, such as wires and spheres may be formed.

In one exemplary embodiment, the present invention provides a system for the light-induced directed self-assembly (LIDSA) of periodic sub-wavelength nanostructures, including: a light source for delivering a beam of photons; a reaction chamber disposed adjacent to the light source; a gas including one or more precursor materials disposed within the reaction chamber; and a substrate disposed within the reaction chamber, wherein the substrate is positioned and configured to receive the beam of photons; wherein the beam of photons causes a periodic sub-wavelength nanostructure of one or more constituents of the one or more precursor materials to form on a surface of the substrate. Optionally, the light source is one of a femtosecond and a picosecond pulsed laser. Optionally, the light source has a peak power of between about 10 $GW/cm^2$ and about 500 $GW/cm^2$. Optionally, the light source has a wavelength of between about 200 nm and about 800 nm. The reaction chamber comprises is vacuum chamber. The substrate includes one of a metal, a semiconductor, and an insulator. Optionally, the beam of photons interacts with the surface of the substrate on a spot having a diameter of between about 200 nm and about 1 mm. Optionally, the beam of photons interacts with the surface of the substrate for a period of time between about 0.1 sec and about 10 sec or at a scanning speed of about 0.1 μm/sec and about 100 μm/sec. The periodic sub-wavelength nanostructure has a feature size of λ/5 or smaller, for example. The system also includes a translation stage coupled to the reaction chamber for selectively translating the substrate with respect to the beam of photons. Optionally, the periodic sub-wavelength nanostructure is used to form one of a polarizer, an integrated optical element, an optical interconnect, a tagging feature, a field enhancement structure, a patterned nano-catalyst, a nano-electrode, and a nano-magnet.

In another exemplary embodiment, the present invention provides a method for the light-induced directed self-assembly (LIDSA) of periodic sub-wavelength nanostructures, including: providing a light source for delivering a beam of photons; providing a reaction chamber disposed adjacent to the light source; providing a gas including one or more precursor materials disposed within the reaction chamber; and providing a substrate disposed within the reaction chamber, wherein the substrate is positioned and configured to receive the beam of photons; wherein the beam of photons causes a periodic sub-wavelength nanostructure of one or more constituents of the one or more precursor materials to form on a surface of the substrate. Optionally, the light source is one of a femtosecond and a picosecond pulsed laser. Optionally, the light source has a peak power of between about 10 $GW/cm^2$ and about 500 $GW/cm^2$. Optionally, the light source has a wavelength of between about 200 nm and about 800 nm. The reaction chamber comprises is vacuum chamber. The substrate includes one of a metal, a semiconductor, and an insulator. Optionally, the beam of photons interacts with the surface of the substrate on a spot having a diameter of between about 200 nm and about 1 mm. Optionally, the beam of photons interacts with the surface of the substrate for a period of time between about 0.1 sec and about 10 sec or at a scanning speed of about 0.1 μm/sec and about 100 μm/sec. The periodic sub-wavelength nanostructure has a feature size of λ/5 or smaller, for example. The method also includes providing a translation stage coupled to the reaction chamber for selectively translating the substrate with respect to the beam of photons. Optionally, the periodic sub-wavelength nanostructure is used to form one of a polarizer, an integrated optical element, an optical interconnect, a tagging feature, a field enhancement structure, a patterned nano-catalyst, a nano-electrode, and a nano-magnet.

BRIEF DESCRIPTION OF THE DRAWINGS

The present invention is illustrated and described herein with reference to the various drawings, in which like reference numbers are used to denote like system components and/or method steps, as appropriate, and in which.

DETAILED DESCRIPTION OF THE INVENTION

Again, in various exemplary embodiments, the present invention provides a DW-LCVD technique that is capable of generating a feature size of $\lambda/5$ or smaller, for example, processing multiple features simultaneously, and controlling the morphology of the deposited features, among other advantages. By gently focusing a single 400-nm 150-femtosecond laser beam or the like onto the surface of a substrate disposed in a vacuum chamber at or near room temperature with tungsten hexacarbonyl ($W(CO)_6$) or the like as a precursor, the spontaneous formation of one-dimensional grating-like nanostructures of tungsten or the like are grown heterogeneously on top of the underlying substrate without requiring any beam shaping, such masks or holography. The nanograting is formed simultaneously, and has a very small feature size. Metallic nanogratings with excellent long-range order are achieved simply by translating the substrate with respect to the laser focus. These metallic nanogratings may be formed on top of a variety of metals, semiconductors, and dielectrics, suggesting that the phenomenon of the present invention is a universal one. Considering the range of materials that may be deposited using DW-LCVD, the systems and methods of the present invention provide a simple, cost-effective, and flexible means to pattern periodic structures.

Figure 1:
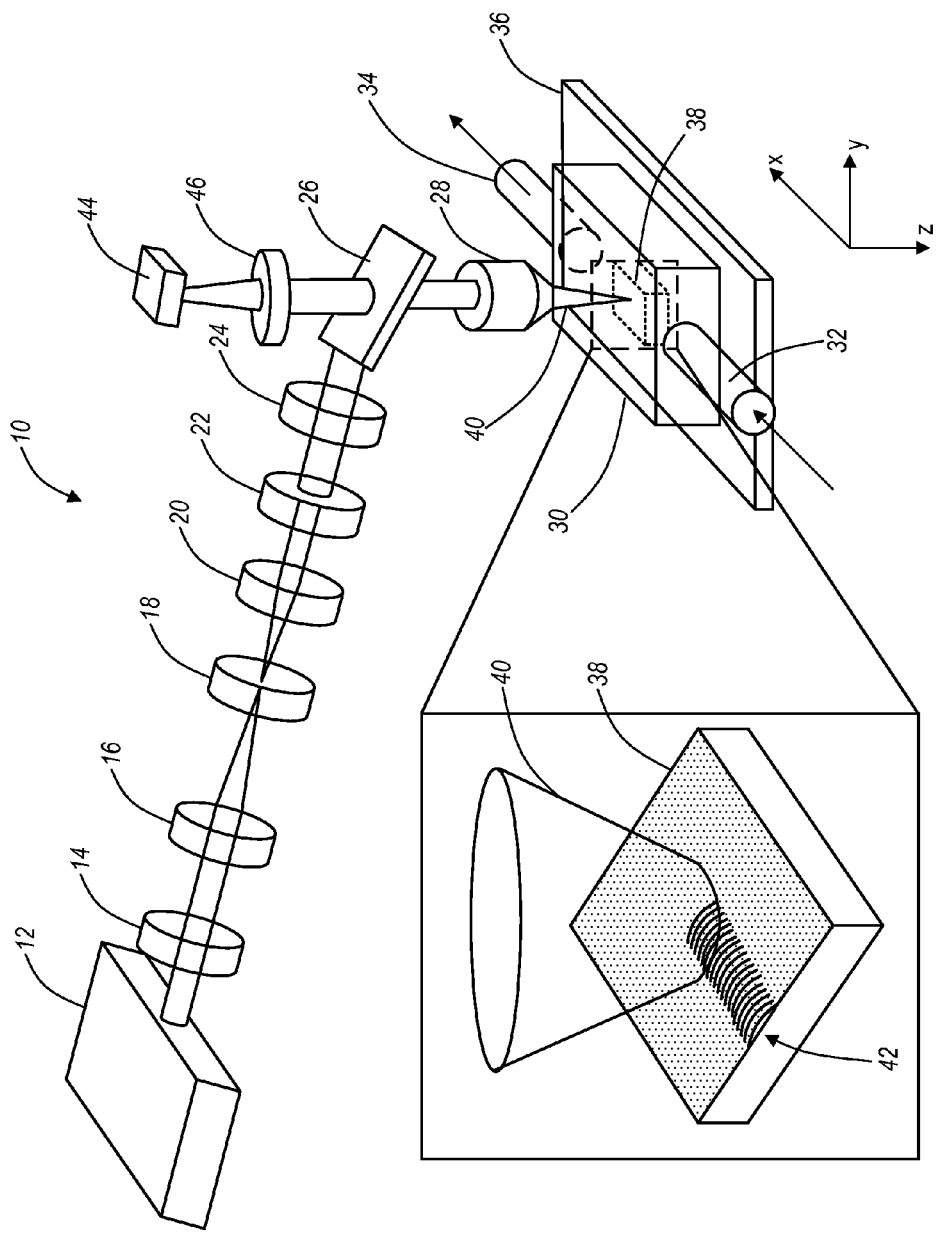
FIG. 1 is a schematic diagram illustrating one exemplary embodiment of the LIDSA system of the present invention, with the insert illustrating nanogratings induced by a single 400-nm femtosecond laser beam or the like without beam shaping.

Referring to FIG. 1, in one exemplary embodiment, the LCVD system 10 of the present invention includes a Ti:sapphire oscillator 12 or the like as a light source, as well as an associated shutter 14, first lens 16 (e.g. f=200 mm), beta barium borate crystal 18 or the like, second lens 20 (e.g. f=70 mm), telescope 22 (e.g. M=2X), and half-wave plate 24 or the like. It will be readily apparent that other equivalent configurations may be utilized. The incident light is reflected by a mirror 26 to an objective 28 (e.g. NA=0.55) and into a vacuum chamber 30. A precursor flow is provided to the vacuum chamber 30 via a precursor flow inlet 32 and a precursor flow outlet 34 that is coupled to a pump (not illustrated). The vacuum chamber 30 is coupled to an XYZ stage 36, or other means are utilized for allowing a substrate 38 disposed within the vacuum chamber to be translated in one or more directions with respect to the incident laser beam 40. Again, it will be readily apparent that other equivalent configurations may be utilized. For example, the laser beam may be scanned with respect to the substrate. As described in greater detail herein below, the incident laser beam initiates the formation of a plurality of periodic sub-wavelength nanostructures 42 on the surface of the substrate 38. These periodic sub-wavelength nanostructures 42 are imaged using a charge-coupled device (CCD) camera 44 or the like, as well as a third lens 46 (e.g. f=150 mm).

Experimental Procedure

The exemplary precursor used was tungsten hexacarbonyl ($W(CO)_6$) (Aldrich, 99.9+%), at or about room temperature with a saturated pressure of about 0.03 mTorr, for example. Ultra-high-purity nitrogen gas was used as a currier gas to transfer the precursor from a reservoir (not illustrated) into the vacuum chamber 30 at about 10 sccm (standard cubic centimeters per minute), pumped by a mechanical pump. The vacuum chamber 30 was mounted on a piezoelectric stage 36 and had a glass viewport through which the laser beam 40 was introduced into the vacuum chamber 30. The laser source was a 400-nm linearly-polarized femtosecond laser generated by frequency doubling the 800-nm, 90-femtosecond pulses from a mode-locked 80-MHz Ti:sapphire oscillator 12 (Kapteyn-Murnane Labs), and was delivered to the vacuum chamber 30 via multiple wavelength-selective (e.g. high reflection at 400 nm and high transmission at 800 nm) mirrors to effectively filter out the fundamental laser beam 40. The laser beam 40 was focused by a 0.55-NA objective 28, through the glass viewport, and incident normally onto the surface of the substrate 38. The objective 28 was under-filled (e.g. effective NA ~0.3) and full width at half maximum (FWHM) spot size at the focal point was calculated to be about 0.8 μm in diameter; the actual spot size on the surface of the substrate 38 was larger due to an aberration caused by the 1-mm thick glass viewport. The laser power was adjusted using a neutral-density filter and the values presented herein were corrected for all losses before the substrate 38. The laser polarization was changed using either the half-wave plate 24 to rotate its linear polarization slate or a quarter-wave plate for circular polarization. Two growth modes were employed. In a stationary mode, the substrate 38 was exposed to the laser beam for a predetermined period of time administrated by a mechanical shutter 14. In a scanning mode, the substrate 38 was translated with respect to the laser beam at a predetermined scanning direction and speed. Both exposure time and stage scanning were controlled and synchronized by a computer. Different substrates 38 were used, including c-plane sapphire ($Al_2O_3$ (0001)), glass, z-cut quartz, calcium fluoride (111), gallium nitride (0001), zinc oxide, silicon nitride, aluminum nitride, magnesium oxide (100), magnesium oxide (111), gold, copper, tungsten, and palladium. These substrates 38 were ultrasonically cleaned using acetone and methanol for 10 min each, followed by a blow dry with dry nitrogen gas before they were loaded into the vacuum chamber 38. The samples were investigated using scanning electron microscopy (SEM) using a Raith 150 system. Contact mode atomic force microscopy (AFM) images were taken with a Veeco NanoMan system. Energy-dispersive X-ray spectroscopy (EDX) spectra were collected on an Oxford Instruments INCA microanalysis system equipped on a JEOL JSM 6480 system. It should be noted that a picosecond pulsed laser may also be used in conjunction with the systems and methods of the present invention.

Experimental Results

Figure 2:
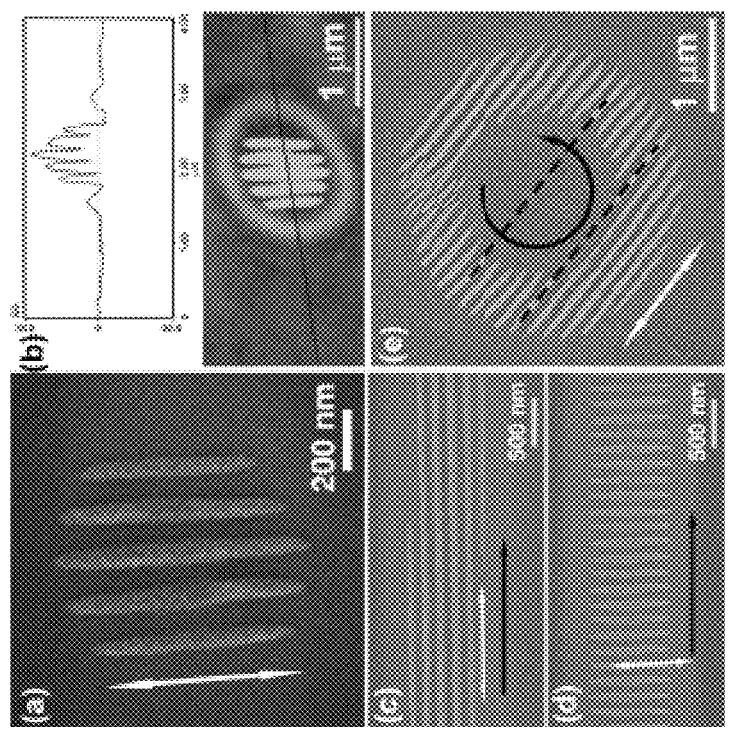
FIGS. 2(a)-2(e) are a plurality of magnified images of nanogratings grown using the LIDSA methods of the present invention.

FIG. 2(a) is a SEM image of a typical tungsten nanograting (TNG) grown using the stationary growth mode with a laser power of 19 mW and an exposure time of 4 sec, and FIG. 2(b)

is an AFM image of a typical TNG grown under similar conditions, along with its cross-sectional profile. Each "tooth" in the TNG resembles a "willow leaf" with an elongate portion and pointed ends. The orientation of these "teeth" was found to be parallel to the laser polarization; and when the input linear polarization was rotated, the orientation of the "teeth" rotated accordingly. The AFM profile, FIG. 2(b), indicates that the height of the "teeth" is maximally about 20-30 nm, and decreases monotonically from the center to the edge, consistent with the Gaussian intensity profile of the focused laser beam. The "teeth" had a maximum line width of about 80 nm ($\lambda/5$) and an average periodicity of about 160 nm ($\lambda/2.5$)-180 nm ($\lambda/2.2$). The AFM profile indicates that there was some background deposition of a thin film with a thickness of less than about 5 nm. The AFM profile, FIG. 2(b), clearly shows that the nanograting structure is grown on top of the surface of the substrate. Control experiments using similar laser beam exposure without precursors produced no detectable patterned surface structures, indicating the nanograting structure was due to laser-induced deposition, rather than surface roughening or the like, such as with conventional LIPSS. In the scanning growth mode, the substrates were translated with respect to the laser beam, and this resulted in TNGs with excellent long-range spatial order. By controlling the laser polarization with respect to the substrate translation direction, long strips of TNGs with various "tooth" orientations were obtained, as illustrated in FIGS. 2(c) and 2(d), which represent longitudinal and transverse gratings, respectively. Both gratings were grown with a laser power of 20 mW and a scanning speed of 0.4 μm/sec. The small angle (~3°) deviation from perfect parallel or perpendicular alignment between the scanning direction (indicated by the black arrow) and the laser polarization (indicated by the white arrow) was mainly due to the coupling between the orthogonal axes in the piezoelectric stage. FIG. 2(e) illustrates a TNG with linear "teeth" embedded in a ring pattern produced with a laser power of 21 mW by translating the substrate at a speed of 1.0 μm/sec in an annular fashion while the laser polarization was held linearly and constant. The length of the "teeth" is short when the scan direction is perpendicular to the laser polarization and becomes longer as the scan direction turns parallel to the laser polarization. It should be noted that the "teeth" at the northwest and southeast portions of the circle fall on the same line, as indicated by the dashed lines in FIG. 2(e). In other words, the spatial coherence between two physically-separate TNGs may be preserved in that they are connected through a third party. Such a unique property may be utilized to generate large-area gratings. The defect at the top corresponds to where the fabrication started and ended, and is due to the hysteresis of the translation stage, which is corrected when a closed-looped stage is used.

Figure 3:
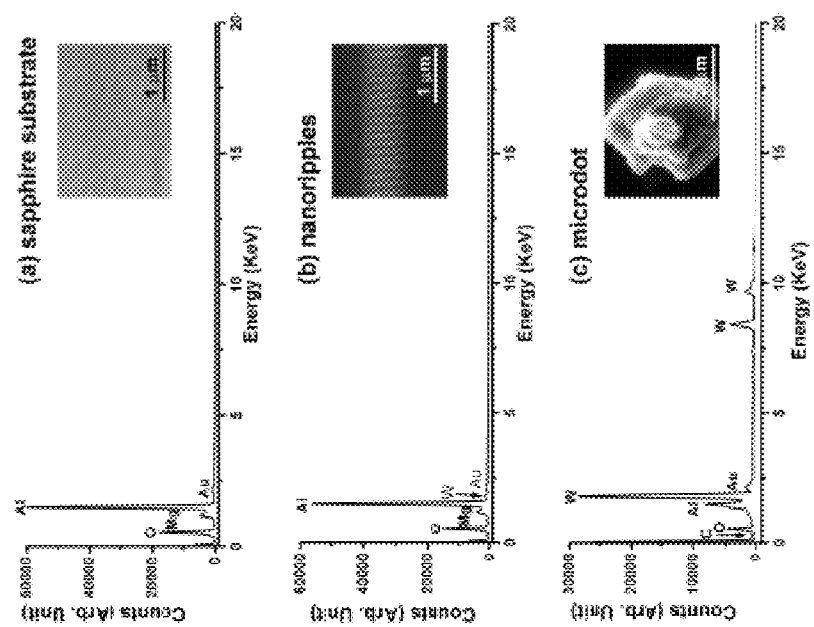
FIGS. 3(a)-3(c) are a plurality of spectra plots and magnified image inserts of bare sapphire, tungsten nanogratings deposited on sapphire using the LIDSA methods of the present invention, and tungsten microdots on sapphire.

In order to determine the composition of the deposited nanograting structure, an EDX study was carried out on bare sapphire, TNGs on sapphire, and tungsten microdots on sapphire (obtained by overexposure for 2 min). Samples were sputtering coated with a ~5.5-nm thick layer of Au before the analysis in order to eliminate the charge effect. All spectra were taken with electron beam energy of 20 KeV and a working distance of 10 mm. The EDX spectra, along with insets of corresponding SEM images, are illustrated in FIGS. 3(a)-3(c). FIG. 3(a) indicates background peaks of O, Mg and Al from the substrate and Au from the coating. FIG. 3(b) indicates, in addition to these background peaks, a clear signature of W. For comparison purposes, these two spectra were taken at the same SEM magnification of 45 K. To further verify that this additional peak was due to W, EDX was also carried out on a micron size dot with a deposition time of ~2 min (FIG. 3(c)) at a SEM magnification of 20 K. Strong W peaks were observed, confirming that the additional peak in FIG. 3(b) was indeed tungsten. A small carbon peak was also observed and was due to the formation of coordinatively unsaturated metal carbonyls and the dissociation of CO, which is commonly seen in the photolytic LCVD of metal carbonyls. The weak W peak of FIG. 3(b) is mainly due to the fact that the thickness of the "teeth" of the TNGs is only about 20-30 nm, as indicated from the AFM study, and that the TNGs only covered a portion of the detection area during the EDX measurement. The W peak, although weak, was stronger than the Au peak that arose from the ~5.5-nm thick continuous Au layer. Comparison of these EDX spectra indicated the dominant presence of tungsten in these nanostructures and confirmed the deposition of tungsten.

Figure 4:
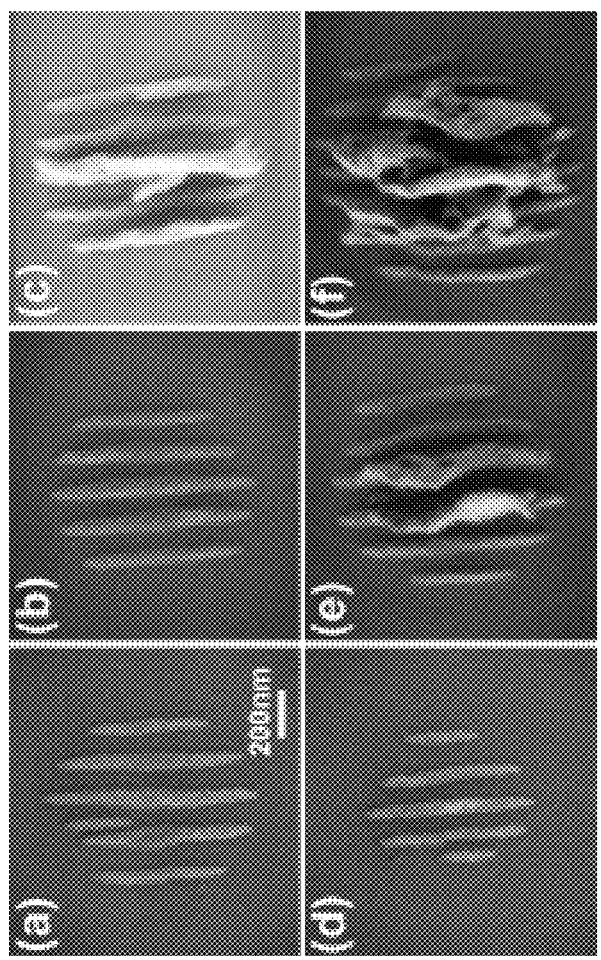
FIGS. 4(a)-4(f) are a plurality of magnified images of tungsten nanogratings grown on sapphire with a laser power of 19 mW at exposure times of between 2 sec and 4 sec and at an exposure time of 4 sec with a laser power of between 17 mW and 24 mW in a stationary growth mode.

The dependence of the morphology of the TNGs on exposure conditions were studied systematically in order to gain insight as to the TNG formation process. In the stationary growth mode, the morphology of the TNGs on sapphire depends strongly on laser power and exposure time. A laser power threshold of about 17 mW was found, below which no TNGs were observed, even for an exposure time of more than 10 sec. For a laser power equal to or higher than about 17 mW, TNGs were well established in about 2 sec (FIG. 4(a)). At a constant laser power of about 19 mW, five "teeth" were found in TNGs for exposure times of between about 2-6 sec (FIG. 4(a)-FIG. 4(c)), during which time the length of the "teeth" increased steadily with increased exposure time before a "flake-like" structure appeared. These "flakes" were more easily scratched away by AFM tips than the individual "teeth" of TNGs. Continued exposure for several minutes led to a tungsten dot with a diameter of several microns (see FIG. 3(c)). At a constant exposure time of 4 sec, beside "tooth" length, the number of "teeth" also increased steadily as power increased; from slightly more than 3 "teeth" at 17 mW (FIG. 4(d)), 5 at 19 mW (FIG. 4(b)), 6 at 22 mW (FIG. 4(e)), to almost 7 at 24 mW (FIG. 4(f)). "Flakes" appeared at 22 mW and grew more at 24 mW (FIG. 4(e)-4(f)).

Figure 5:
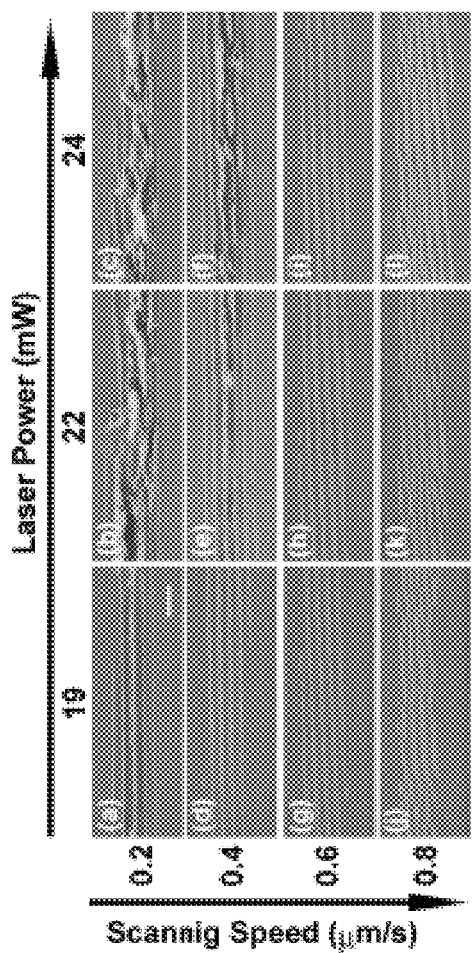
FIGS. 5(a)-5(l) are a plurality of magnified images of longitudinal tungsten nanogratings grown on sapphire at various laser powers and scanning speeds in a scanning growth mode.
Figure 6:
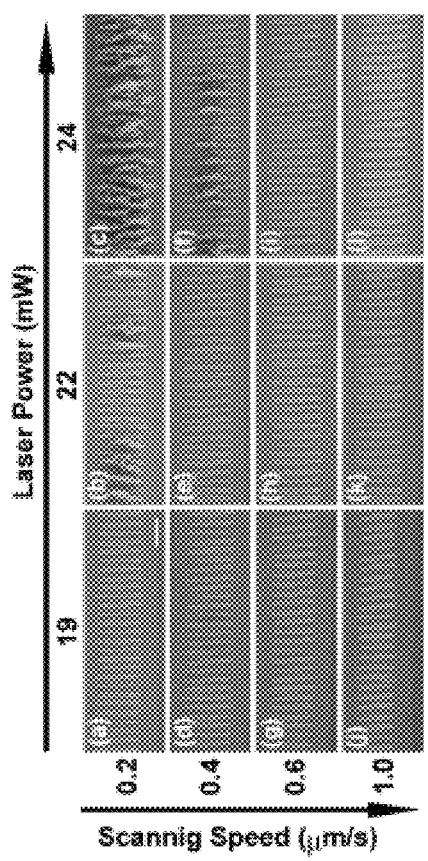
FIGS. 6(a)-6(l) are a plurality of magnified images of transverse tungsten nanogratings grown on sapphire at various laser powers and scanning speeds in a scanning growth mode.

Similar trends were observed for TNGs grown in the scanning growth mode, as illustrated in FIG. 5 for a longitudinal grating and FIG. 6 for a transverse grating. In particular, the dependence of the "tooth" length and grating period of transverse TNGs on substrate scanning speed for different laser powers is illustrated in FIGS. 7(a) and 7(b), respectively. A potential power threshold of about 17 mW was again found. At lower laser powers and/or shorter dwell times (i.e. faster scanning speeds), the TNGs were clean (lower and left corners of FIGS. 5 and 6). As laser powers increased and/or dwell time became longer, more parallel lines and/or longer "teeth" were observed for longitudinal and transverse gratings, respectively. Both the "tooth" length and grating period exhibited a monotonic dependence on scanning speed and laser power. At even higher laser powers and longer dwell times, the TNGs were again covered with "flakes" (upper and right corners of FIGS. 5 and 6). One noticeable difference between the longitudinal and transverse gratings was that the former became broken and disconnected at a scanning speed of about 0.8 μm/sec (last row of FIG. 5), whereas the latter remained ordered at scanning speeds of up to about 1.0 μm/sec (last row of FIG. 6). This difference is most likely due to the nature of longitudinal gratings. In order to form, longitudinal gratings require that the "teeth" of the TNGs are connected along their longer axes as the substrate scans across the laser beam. If the displacement is longer than the "teeth," then the "teeth" developed over adjacent exposure areas will not be connected and will appear to be broken.

Control of the period of the tungsten nanogratings may also be achieved by, in addition to changing laser power and scanning speed, changing the wavelength of the laser beam. By reducing the wavelength, the period of the tungsten nanogratings scales accordingly, as illustrated in FIG. 7(c). Thus, shorter wavelength is expected to produce smaller feature size.

Figure 12:
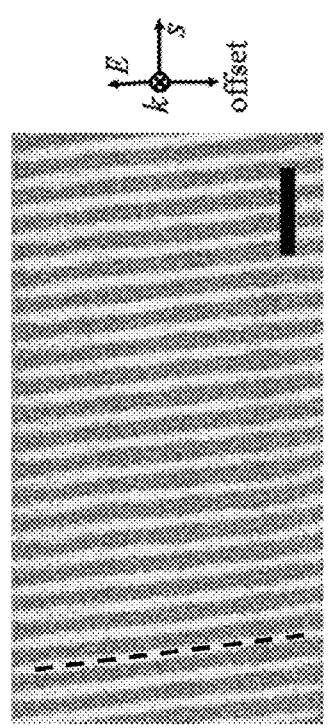
FIG. 12 is a magnified image of a large-area tungsten nanograting made of multiple scanned TNGs with overlap, with the inset indicating the relative orientations among laser incidence (k), substrate scanning (S), laser polarization (E), and offset.

FIGS. 7(a) and 7(b) also reveal good uniformity of "tooth" length and grating period: the standard deviation (one sigma) is between 1.5% and 4% for the former and between 0.75% and 1.5% for the latter. The small deviation (<1.5%) in the grating period, obtained with a method like this without any external reference, suggests that the presence of the existing "tooth" determines the location of next "tooth" in a precise manner. This excellent spatial registration among neighboring "teeth" is exploited to fabricate larger-scale one-dimensional gratings by performing multiple linear scans with proper offset in the direction orthogonal to the substrate scanning. As demonstrated in FIG. 12, with a vertical offset of about 500 nm the grating "teeth" between adjacent scans are connected to form nearly a straight line.

Figure 13:
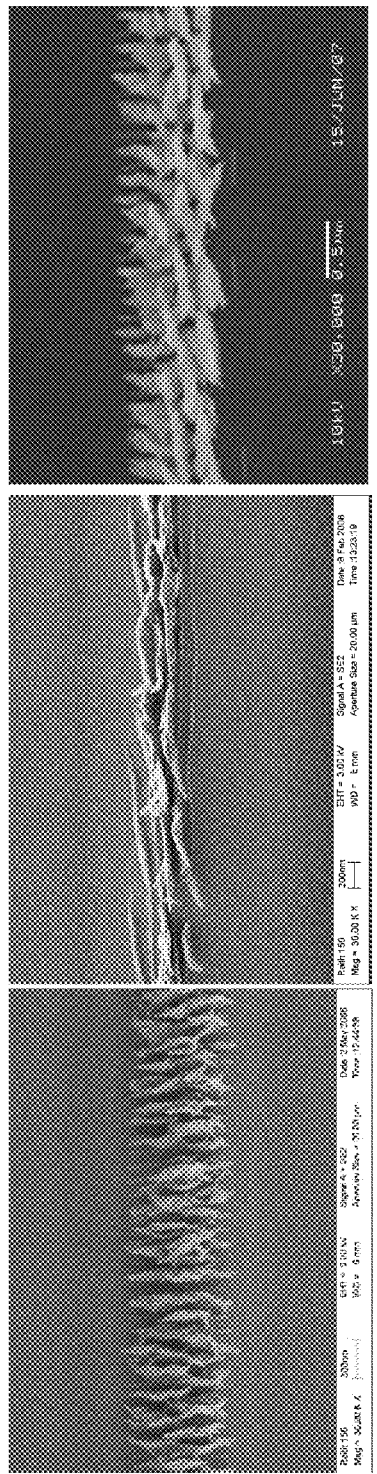
FIGS. 13(a)-13(c) are a plurality of magnified images of (a) transverse tungsten nanoflakes on a transverse tungsten nanograting, (b) longitudinal tungsten nanoflakes on a longitudinal tungsten nanograting, and (c) longitudinal tungsten nanoflakes on transverse tungsten nanoflakes.

After the TNGs are developed on the substrate surface, continued exposure to light results in "flakes" on top of the TNGs. These flakes are very thin and long tungsten protrusions with an aspect ratio more than 30 to 1. These "flakes" grow much faster than the TNGs, as illustrated by the significant increase in the deposited tungsten observed by comparing FIGS. 4(d) and 4(f). This indicates that the "flakes" undergo a different and more efficient growth mechanism than the TNGs. Indeed, the presence of an underlying metal surface may significantly increase the rate of photochemistry by providing other channels for photo-dissociation of the precursors than direct photo-excitation. Unlike semiconductors or insulators, metals may absorb the light significantly due to the large quantities of free carriers present. The short pulse duration of femtosecond pulsed lasers enables the efficient generation of large densities of excited carriers and/or photoelectrons in the substrates, which are known to facilitate surface photochemistry via multiple resonant tunneling or electron impact. Alternatively, these hot carriers could result in substantial heating of the substrate electrons near the surface, which could enhance thermal dissociation of the adsorbates. Tungsten nanoflakes can also be made on transverse tungsten nanograting and longitudinal tungsten nanograting, as shown in FIGS. 13(a)-13(c). Furthermore, additional layer of tungsten nanoflakes may be made on top of existing nanoflakes by scanning the laser beam over the same area with orthogonal polarization, as shown in FIG. 13(c).

Figure 7:
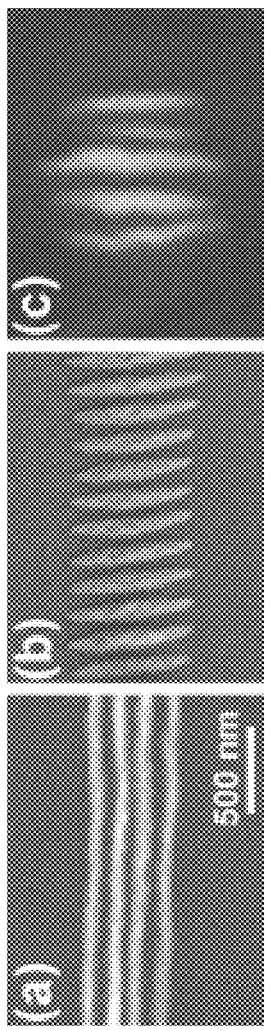
FIGS. 7(a)-7(c) are a plurality of magnified images of tungsten nanogratings on a variety of substrates.
Figure 8:
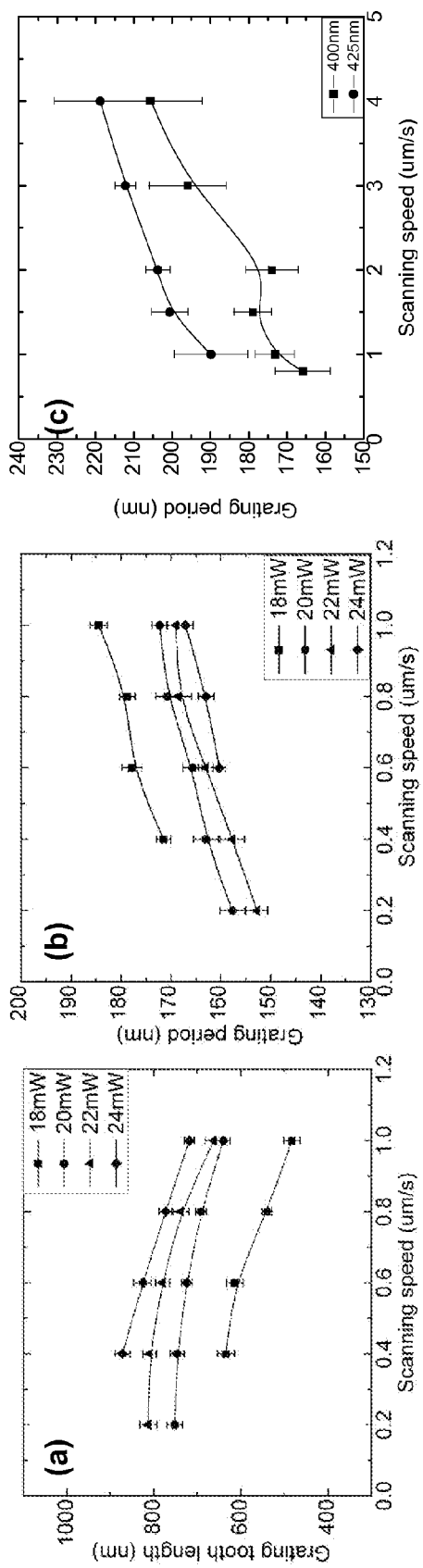
FIGS. 8(a)-8(c) are a plurality of plots illustrating the dependence of (a) grating tooth length, (b) grating period of transverse TNGs on substrate scanning speed for different laser powers, and (c) grating period of transverse TNGs on laser wavelengths.

Similar TNGs were also observed on substrates other than sapphire, including insulators (e.g. glass, fused and crystalline quartz, calcium fluoride, magnesium oxide (100), and magnesium oxide (111)), wide-bandgap semiconductors (e.g. gallium nitride, silicon nitride, zinc oxide, and aluminum nitride), and metals (e.g. gold, copper, tungsten, and palladium). Some of these results are illustrated in FIG. 7 (FIG. 7(a)—glass at laser power 22 mW and scanning speed 0.2 µm/sec, FIG. 7(b)—gallium nitride at laser power 26 mW and scanning speed 0.8 µm/sec, and FIG. 7(c)—gold at laser power 22 mW and exposure time 1 sec). These materials have large differences in their material properties, such as dielectric constant, light absorption, and electronic bandgap, etc. Although variations in growth conditions (laser power and exposure time/scanning speed) and morphologies existed, the fact that TNGs were present on all of these substrates suggest that their growth is a universal phenomenon.

The transmission of 400-nm light through sapphire substrates under similar focusing conditions as in the actual experiments but without the presence of precursors was measured. Negligible absorption in sapphire was found with laser focused either on or above the substrates, indicating very little substrate heating, if any. This suggests that the photo-dissociation of tungsten precursors is induced by the direct absorption of incident photons, rather than by photo-excited hot carriers in the substrates. Since the total dissociation energy of $W(CO)_6$ to produce ground-state W is around 11 eV, such reaction requires at least four photons at 400 nm (3.1 eV) to complete. The nature of the precursor decomposition is therefore nonlinear in laser intensity. This is consistent with the observation that the formation of TNGs was found to be very sensitive to the laser focusing condition. Given the same laser input power and exposure time/scanning speed, different morphologies would be observed if the laser focusing was different from run to run, or even in the same run, if the surface height with respect to laser focus varies considerably during scanning.

Figure 9:
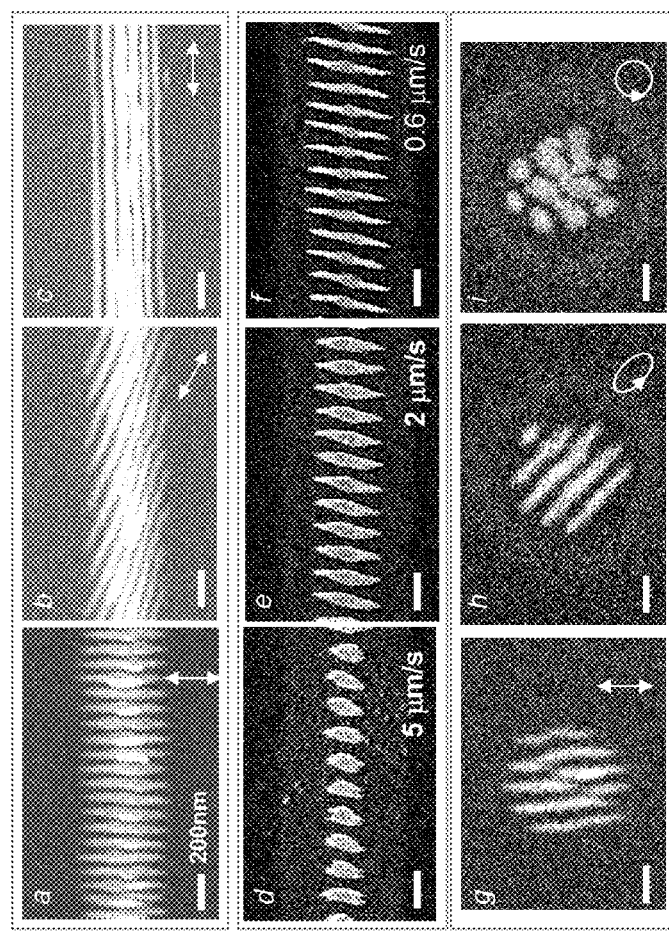
FIGS. 9(a)-9(i) are a plurality of magnified images of tungsten nanogratings produced by (a-c) different orientations of linear polarization, (d-f) different scanning speeds, and (g-i) different degrees of ellipticity of light polarization.
Figure 10:
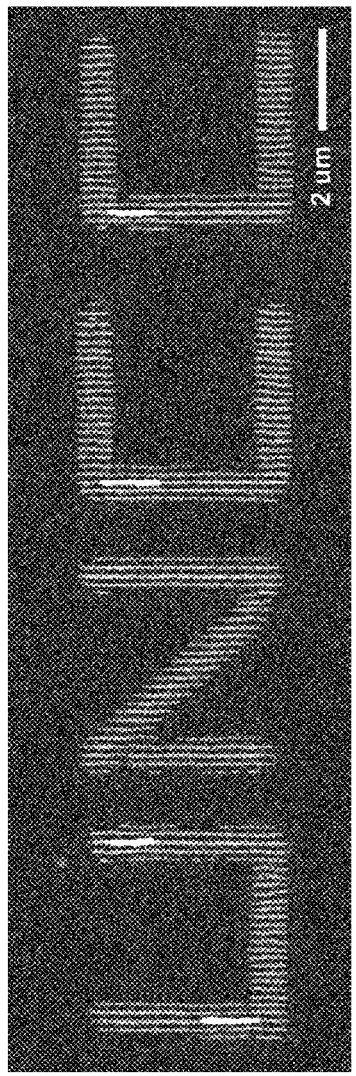
FIG. 10 is a magnified image of tungsten nanostructures representing the letters "UNCC" directly written using LIDSA methods of the present invention.
Figure 11:
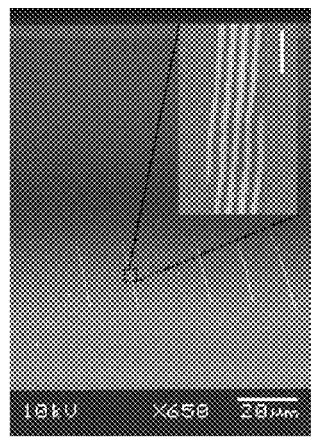
FIG. 11 is a magnified image of a longitudinal tungsten nanograting made on the curved surface of an optical fiber.

LIDSA can control the morphology of a tungsten nanostructure, including its orientation, aspect ratio, and feature sharpness, using only the intrinsic properties of light. For example, an array of nanorods (i.e. transverse gratings) can turn into an array of nanowires (i.e. longitudinal gratings) simply by rotating the light polarization by 90°, as shown in FIGS. 9(a)-9(c). Decreasing the scanning speed leads to longer and narrower nanorods with increasing aspect ratios, as shown in FIGS. 9(d)-9(f); increasing the ellipticity of the light reduces the sharpness of the nanorods from very sharp at linear polarized light to a two-dimensional array of disks at circular polarization, as shown in FIGS. 11(g)-11(i).

Figure 14:
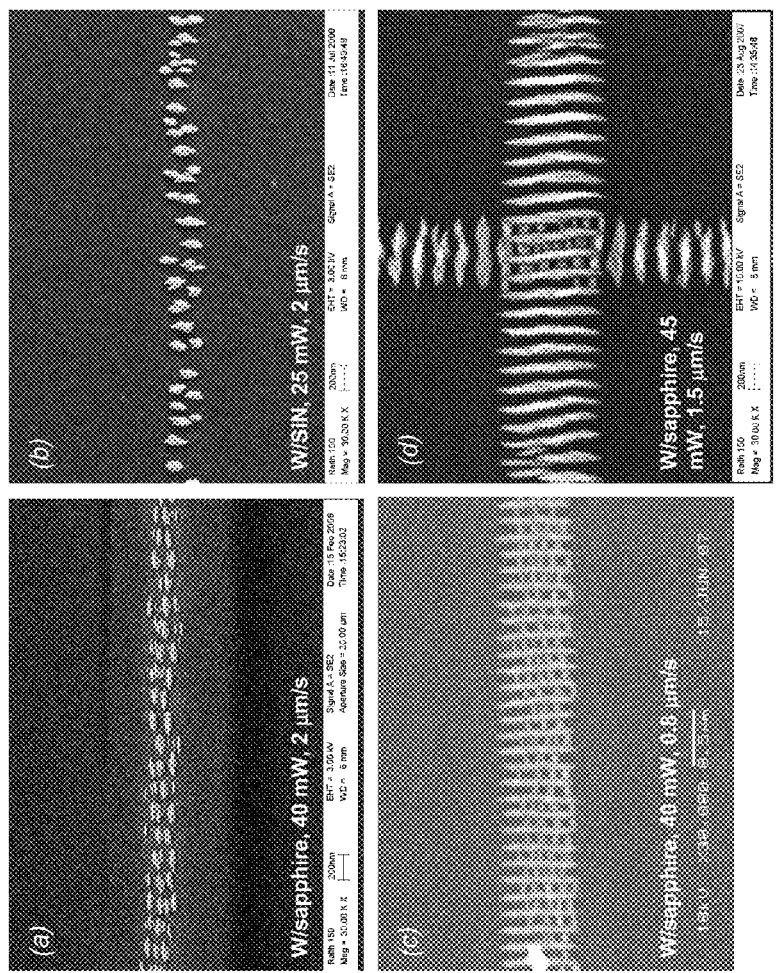
FIGS. 14(a)-14(d) are a plurality of magnified images of quasi-multidimensional nanostructures formed using the LIDSA methods of the present invention.

LIDSA can also produce a quasi-two-dimensional periodic array of tungsten nanostructures. A single scan with fast scanning speed produces a quasi-2D array of discrete nanodots elongated along the laser polarization direction, as shown in FIGS. 14(a) and 14(b) for horizontal and vertical light polarization, respectively. Connected quasi-2D meshes can be produced by scanning the previously exposed area one more times with orthogonal polarizations, with or without the same power and scanning speed, as shown in FIGS. 14(c) and 14(d).

Figure 15:
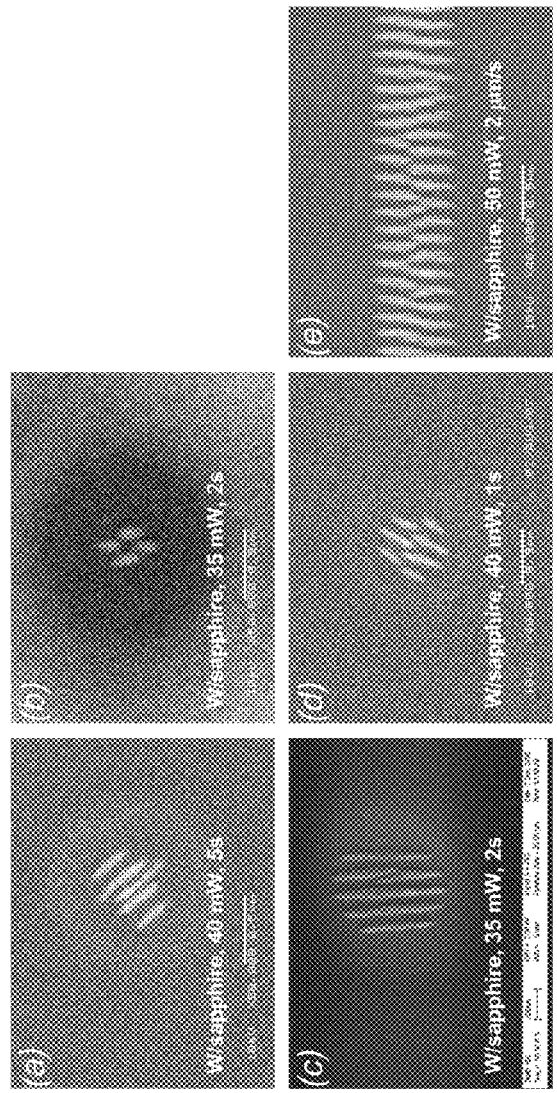
FIGS. 15(a)-15(e) are another plurality of magnified images of tungsten nanostructures having higher spatial frequency using the LIDSA methods of the present invention

LIDSA can also produce tungsten nanostructures with higher spatial frequency. For example, FIG. 15(a) provides an enlarged image of tungsten nanogratings obtained with static growth mode in which one extra grating tooth appears in otherwise periodic grating teeth. This extra tooth halves the nearest distance among neighboring grating teeth and therefore increases teeth density per unit length. FIG. 15(b) provides an enlarged image of four tungsten nanodots arranged symmetrically around the center of the exposure with the nearest distance among neighboring nanodots half of that in the tungsten nanograting. FIG. 15(c) provides an enlarged image of a tungsten nanograting with a sharp defect in one of the grating teeth where deposition is void. Such sharp defects create very small gaps among neighboring nanostructures. FIG. 15(d) provides an enlarged image of a tungsten nanograting with the top half and bottom half interleaving with respect to each other (i.e. phase offset by 180 degrees), which produces sharp gaps among the tips of these gratings. FIG. 15(e) provides an enlarged image of a tungsten nanograting in which interleave occurs during transverse scanning with relative high power and scanning speed. Again such interleave produces sharp gaps among the tips of the grating teeth.

Since multiple lines were formed by a single laser beam at one time, the nominally serial nature of DW-LCVD turns into a parallel approach without adding any instrumental complexity. Such a unique property of LIDSA offers the capability to fabricate micro and sub-microstructures hierarchically integrated with well-defined nanoscale features in a single step. For example, linear "teeth" embedded in a ring pattern can be produced with a laser power of 21 mW by translating the substrate at a speed of 1.0 µm/sec in an annular fashion while the laser polarization was held linearly and constant. The length of the "teeth" is short when the scan direction is perpendicular to the laser polarization and becomes longer as the scan direction turns parallel to the laser polarization. The spatial coherence between two physically-separate teeth is preserved in that they are connected through a third party.

Again, by way of summary, in the simplest exemplary embodiment, a single linearly-polarized femtosecond pulsed ultraviolet laser beam is gently focused normally onto a desired substrate using a lens or optical microscope objective. The substrate resides in a reaction chamber with a steady flow of gas-phased precursor molecules at a desired partial pressure in a carrier gas. During exposure to the laser beam, the substrate either stays static or may be translated. Laser power, polarization, exposure time, as well as scanning speed are controlled. In addition to the femtosecond pulsed laser, picosecond pulsed lasers also induce sub-wavelength ripples, at a somewhat lower efficiency, but also at a somewhat lower peak power, which may be desirable for delicate or soft substrates.

Most precursors have a dissociation energy of ~6-10 eV, which requires a photon wavelength of ~200 nm or below (i.e. deep UV) and few lasers are available in this spectral regime with good beam quality. However, the efficient dissociation of precursors can be achieved using femtosecond UV pulsed laser (such as 400 nm) via multiphoton absorption. Light sources with smaller wavelength (such as the third harmonic of Ti:Sapphire laser—266 nm) are expected to produce tungsten nanostructures with even higher efficiency and smaller feature size. TNSs may also be produced using a deep UV source with one-photon absorption, for example, which might have the advantage of even smaller periodicity and spatial feature size. In addition to the femtosecond pulsed laser, picosecond pulsed lasers could also induce TNSs, at a somewhat lower efficiency, but also at a somewhat lower peak power, which may be desirable for delicate or soft substrates.

The processes of the present invention normally take place at or near room temperature with reasonable precursor flow rates. The processes described above may be optimized by controlling the precursor flow rate, and the ambient and substrate temperatures.

Although periodic lines have been observed, non-periodic single lines may also be produced using the same mechanism by proper control of the laser spot size to be slightly wider than the observed periodicity. Single lines of arbitrary length may be fabricated by scanning the laser beam across the substrates. More sophisticated patterns, such as 2D mesh networks of polygons, squares, or rectangles, may be generated using multiple laser beams, provided that these beams are uncorrelated among themselves, i.e. there is no spatial or temporal coherence with respect to one another. In such an alternative embodiment, multiple uncorrelated laser beams are spatially combined before being focused onto the substrates. The spatial periodicity of the ripples obtained by the present invention may be controlled by changing the laser wavelengths and incident angles.

As illustrated and described above, a single precursor species is used over distinctive substrates. Multiple precursor species may, however, be used in series, which would results in periodic nanostructures with a heterogeneous composition. Alternatively, multiple precursors could be used simultaneously to produce periodic nanostructures with homogeneous alloy-type compositions.

As illustrated and described above, tungsten metal is deposited over a variety of insulators and wide-bandgap semiconductors, including sapphire, glass, calcium fluoride, fused quartz, and gallium nitride. However, periodic sub-wavelength ripples of any materials, provided proper precursors that are photo-dissociable are available, could be generated using the systems and methods of the present invention, with any substrates, including dielectrics, semiconductors, and metals. The processes of the present invention could also be applied to substrates with non-planar geometries, such as cylinders or spheres. These processes could also be applied to organic substrates because of their low processing temperatures, etc.

An unfocused laser beam with large beam diameter may also be used, provided it has the same peak intensity as has been illustrated and described above. This larger beam size would produce more periodic lines/wires given the same exposure and, therefore, would be extremely useful for large-area patterning.

Applied to various precursor systems, the systems and methods of the present invention provide a simple and cost-effective technique for rapid the prototyping of optical gratings, for example, for applications in various areas of photonics, such as sub-wavelength metallic-grid polarizers, grating-coupled waveguides, and enhanced light extraction of light-emitting diodes (LEDs). Metal or semiconductor gratings could also serve as ordered catalysts for the growth of one-dimensional nanostructures. In addition to rapid prototyping, the uniquely nanostructured surface of the present invention could find other interesting applications in sensing. For example, sharp metallic tips, such as the apexes of the TNGs could enable strong field enhancement as optical antenna for enhanced sensing and optical nonlinearity. The "flakes" significantly increase the effective surface area of the substrates and could he used to enhance catalytic reactions.

Combining the simplicity of the processes of the present invention and the material flexibility LCVD, periodic sub-wavelength nanostructures of any desired materials on any desired substrates may be formed. Potential applications include, but are not limited to:
1. Polarizers: Sub-wavelength metallic gratings possess strong polarization anisotropy based on plasmonic effects. Depending on the periodicity, metallic grid polarizers may work from UV to THz.
2. Integrated Optical Elements: Dielectric (semiconductor or insulator) gratings are important element for integrated planar lightwave circuits (PLCs), such as input/output couplers, mode converters, waveguide couplers, deflectors, spectral filters, etc.
3. Optical Interconnects: Dielectric and/or metallic lines may be used as optical waveguides for optical interconnects in integrated optical circuits. Metallic lines of 100 nm in width are of special interest due to the large permittivity of conductors that may squeeze light in the sub-wavelength dimension for high-density integration.
4. Tagging: Combination of gratings with different pitches could be used for identification, just like barcodes, which may easily be read by its far-field diffraction pattern.
5. Field Enhancement: Sharp tips at the apexes of the metallic ripples are known to have enhanced electric fields. Such field enhancements may be used as optical nano-antennae to create localized and strong electric fields for high-resolution and highly sensitive spectroscopy and biochemical sensing, enhanced optical nonlinearity.

6. Patterned Nano-Catalysts: Metallic and semiconductor ripples/lines may be used as nano-catalysts for the growth of one-dimensional nanostructures and/or for chemical reactions in general, such as toxic gas conversion. Their sub-wavelength periodicity also provides a convenient way for the growth of ordered nanostructures without tedious lithographic processes.

7. Nano-Electrodes and Electrical Interconnects: Metallic lines may be used as nano-electrodes and electrical interconnects in nano-circuits and nano-devices. This unique property of direct-writing allows for the deposition of multiple lines onto desired locations.

8. Nano-Magnets: Magnetic ripples and lines may be used as ordered nano-magnets for information storage and electronics devices.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A method for the light-induced directed self-assembly of periodic sub-wavelength nanostructures, comprising:
   providing a light source for delivering a single beam of photons;
   providing a reaction chamber disposed adjacent to the light source;
   providing a gas comprising one or more precursor materials disposed within the reaction chamber; and
   providing a substrate disposed within the reaction chamber, wherein the substrate is positioned and configured to receive the single beam of photons directed to the substrate from the light source;
   wherein the single beam of photons causes a periodic sub-wavelength nanostructure of one or more constituents of the one or more precursor materials to form on a surface of the substrate within an area of exposure to the single beam of photons parallel to a laser polarization of the single beam of photons via a light-induced directed self-assembly mechanism prior to any translation of the light source or the substrate.

2. The method of claim 1, wherein the light source comprises one of a femtosecond and a picosecond pulsed laser.

3. The method of claim 1, wherein the light source comprises a peak power of between about 10 GW/cm$^2$ and about 500 GW/cm$^2$.

4. The method of claim 1, wherein the light source comprises a wavelength of between about 200 nm and about 800 nm.

5. The method of claim 1, wherein the reaction chamber comprises a vacuum chamber.

6. The method of claim 1, wherein the substrate comprises one of a metal, a semiconductor, and an insulator.

7. The method of claim 1, wherein the beam of photons interacts with the surface of the substrate on a spot having a diameter of between about 200 nm and about 1 mm.

8. The method of claim 1, wherein the beam of photons interacts with the surface of the substrate for a period of time between about 0.1 sec and about 10 sec or at a scanning speed of about 0.1 μm/sec and about 100 μm/sec.

9. The method of claim 1, wherein the periodic sub-wavelength nanostructure comprises a feature size of $\lambda/5$ or smaller, wherein $\lambda$ is the wavelength of the beam of photons.

10. The method of claim 1, further comprising providing a translation stage coupled to one or more of the light source and the reaction chamber for selectively translating the substrate with respect to the beam of photons.

11. The method of claim 1, wherein the periodic sub-wavelength nanostructure is used to form one of a polarizer, an integrated optical element, an optical interconnect, a tagging feature, a field enhancement structure, a patterned nano-catalyst, a nano-electrode, and a nano-magnet.

* * * * *